United States Patent
Jeon et al.

(10) Patent No.: US 9,692,437 B2
(45) Date of Patent: Jun. 27, 2017

(54) ANALOG-TO-DIGITAL CONVERTING DEVICE AND METHOD OF OPERATING ANALOG-TO-DIGITAL CONVERTING DEVICE

(71) Applicant: ELECTRONICS AND TELECOMMUNICATIONS RESEARCH INSTITUTE, Daejeon (KR)

(72) Inventors: Young-deuk Jeon, Daejeon (KR); Min-Hyung Cho, Daejeon (KR); Yi-Gyeong Kim, Daejeon (KR); Chun-Gi Lyuh, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 15/083,096

(22) Filed: Mar. 28, 2016

(65) Prior Publication Data

US 2016/0336951 A1 Nov. 17, 2016

(30) Foreign Application Priority Data

May 13, 2015 (KR) .................. 10-2015-0066780

(51) Int. Cl.
*H03M 1/10* (2006.01)
*H03M 1/12* (2006.01)

(52) U.S. Cl.
CPC ............. *H03M 1/109* (2013.01); *H03M 1/12* (2013.01)

(58) Field of Classification Search
CPC .................................. H03M 1/12; H03M 1/00
USPC ..................... 341/120, 155, 156, 118, 119
See application file for complete search history.

(56) References Cited

U.S. PATENT DOCUMENTS

| | | | |
|---|---|---|---|
| 8,933,830 B1 | 1/2015 | Jeon | |
| 2005/0242836 A1 | 11/2005 | Goetting et al. | |
| 2010/0001892 A1* | 1/2010 | Aruga | H03M 1/1047 341/172 |
| 2015/0002216 A1 | 1/2015 | Jeon et al. | |

FOREIGN PATENT DOCUMENTS

| | | |
|---|---|---|
| KR | 10-2003-0033751 A | 5/2003 |
| KR | 10-2008-0010580 A | 1/2008 |

OTHER PUBLICATIONS

F. Azaïs et al., "Towards an ADC BIST Scheme using the Histogram Test Technique", Test Workshop Proceedings IEEE European, 2000, pp. 53-58, IEEE.

* cited by examiner

*Primary Examiner* — Joseph Lauture (57) ABSTRACT

Provided is an analog-to-digital converting device. The analog-to-digital converting device may include a determination circuit that determination whether a reference digital signal or a determination digital signal obtained by conversion of a reference voltage or a determination voltage matches a test pattern for the reference voltage, and it is possible to monitor whether the analog-to-digital converting device normally operates, according to whether there is matching.

12 Claims, 6 Drawing Sheets

ANALOG-TO-DIGITAL CONVERTING DEVICE AND METHOD OF OPERATING ANALOG-TO-DIGITAL CONVERTING DEVICE

CROSS-REFERENCE TO RELATED APPLICATIONS

This U.S. non-provisional patent application claims priority under 35 U.S.C. §119 of Korean Patent Application No. 10-2015-0066780, filed on May 13, 2015, the entire contents of which are hereby incorporated by reference.

BACKGROUND

The present disclosure herein relates to an analog-to-digital converting device and a method of monitoring analog-to-digital conversion, and more particularly to, an analog-to-digital converting device and a method of monitoring analog-to-digital conversion that monitor a bit error that may occur when performing analog-to-digital conversion.

An analog-to-digital converting (ADC) device is a device that converts an analog signal into a digital signal.

The analog-to-digital converting device is being used for converting analog signals received from various sensors into digital signals.

In order to verify the performance of the ADC device, a built-in-self test (BIST) function may be built in the ADC device. The BIST function needs several hundreds to several thousands of clocks for performing once. Thus, the BIST function is performed once in the initial state before the ADC device operates or performed before a chip in which the ADC device is built is released as a goods.

In the case where the ADC device should convert an analog signal into a digital signal to output zero, it may output one or in the case where the ADC device should output one, it may output zero.

In the above cases, errors that result from the ADC device are referred to as bit errors.

Industry fields that need safety and reliability, such as an automobile industry, an aerospace industry, and a bio industry need the reliability of the ADC device. Thus, a function of determining in real time whether there is a bit error in an ADC output is needed.

Therefore, there is a need for a new device and method that may real-time monitor a bit error that occurs in the digital conversion process.

SUMMARY

The present disclosure provides an analog-to-digital converting (ADC) device that real-time monitors a bit error occurring in the digital conversion process to have more enhanced reliability than a typical ADC device, and a method of monitoring the ADC device.

An embodiment of the inventive concept provides an analog-to-digital converting device includes a reference voltage generation circuit configured to generate a reference voltage; a signal selection circuit configured to output input signals received from an input circuit and reference voltages generated from the reference voltage generation circuit, in response to a selection signal; an analog-to-digital (AD) conversion circuit configured to convert an output signal from the signal selection circuit into a digital signal; and a determination circuit configured to determine whether a reference digital signal obtained by conversion of the reference voltage matches a test pattern for the reference voltage.

In an embodiment, The reference voltage generation circuit may be configured to generate a first reference voltage and a second reference voltage in a first operation mode.

In an embodiment, the signal selection circuit may be configured to output the first reference voltage, sequentially output the analog input signals, and then output the second reference voltage.

In an embodiment, the determination circuit may be configured to compare the first reference digital signal obtained by conversion of the first reference voltage with a first test pattern for the first reference voltage, output digital signals obtained by conversion of the received analog input signals in a case where as a result of the comparison, there is matching, and output an error signal in a case where as a result of the comparison, there is mismatching.

In an embodiment, the analog-to-digital converting device may further include an output circuit configured to store the digital signals obtained by the conversion of the analog input signals, wherein the determination circuit may be configured to compare a second reference digital signal obtained by conversion of the second reference voltage with a second test pattern for the second reference voltage, request to output the digital signals stored in the output circuit in a case where as a result of the comparison, there is matching, and request to neglect the digital signals stored in the output circuit in a case where as a result of the comparison, there is mismatching.

In an embodiment, the analog-to-digital converting device may further include a determination voltage generation circuit that is configured to generate a first determination voltage and a second determination voltage in a second operation mode.

In an embodiment, the signal selection circuit may be configured to output the first determination voltage, sequentially output the received analog input signals, and then output the second determination voltage, in the second operation mode.

In an embodiment, the analog-to-digital converting device may further include an output circuit configured to store digital signals obtained by conversion of the analog input signals, wherein the determination circuit may be configured to compare first and second determination digital signals obtained by conversion of the first and second determination voltages with first and second test patterns for the first and second reference voltages, respectively and request to neglect the digital signals stored in the output circuit in a case where as a result of the comparison, there is at least one matching.

In an embodiment, the determination circuit may be configured to compare some of first and second determination digital signals obtained by conversion of the first and second determination voltages with some of first ands second test patterns for the first and second reference voltages, respectively to determine whether there is matching.

In an embodiment, the determination circuit may be configured to compare a part of the reference digital signal obtained by conversion of the generated reference voltage with a part of the test pattern for the reference voltage.

In an embodiment of the inventive concept, an operating method of an analog-to-digital converting device includes converting a reference voltage into a reference digital signal by the analog-to-digital converging device; comparing the reference digital signal with a test pattern by the analog-todigital converging device; and converting and outputting analog signal received from an external device into digital signals by the analog-to-digital converging device, when a part of the reference digital signal matches at least a part of the test pattern.

In an embodiment of the inventive concept, an operating method of an analog-to-digital converting device includes converting a determination voltage into a determination digital signal by the analog-to-digital converging device; comparing the determination digital signal with a test pattern by the analog-to-digital converging device; and determining that the determination does not normally operate, when a part of the a part of the reference digital signal matches at least a part of the test pattern digital signal matches at least a part of the test pattern.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

In the following, embodiments of the inventive concept are described in detail with reference to the accompanying drawings in order for a person skilled in the art to which the inventive concept pertains, to easily practice the technical spirit of the inventive concept.

Figure 1:
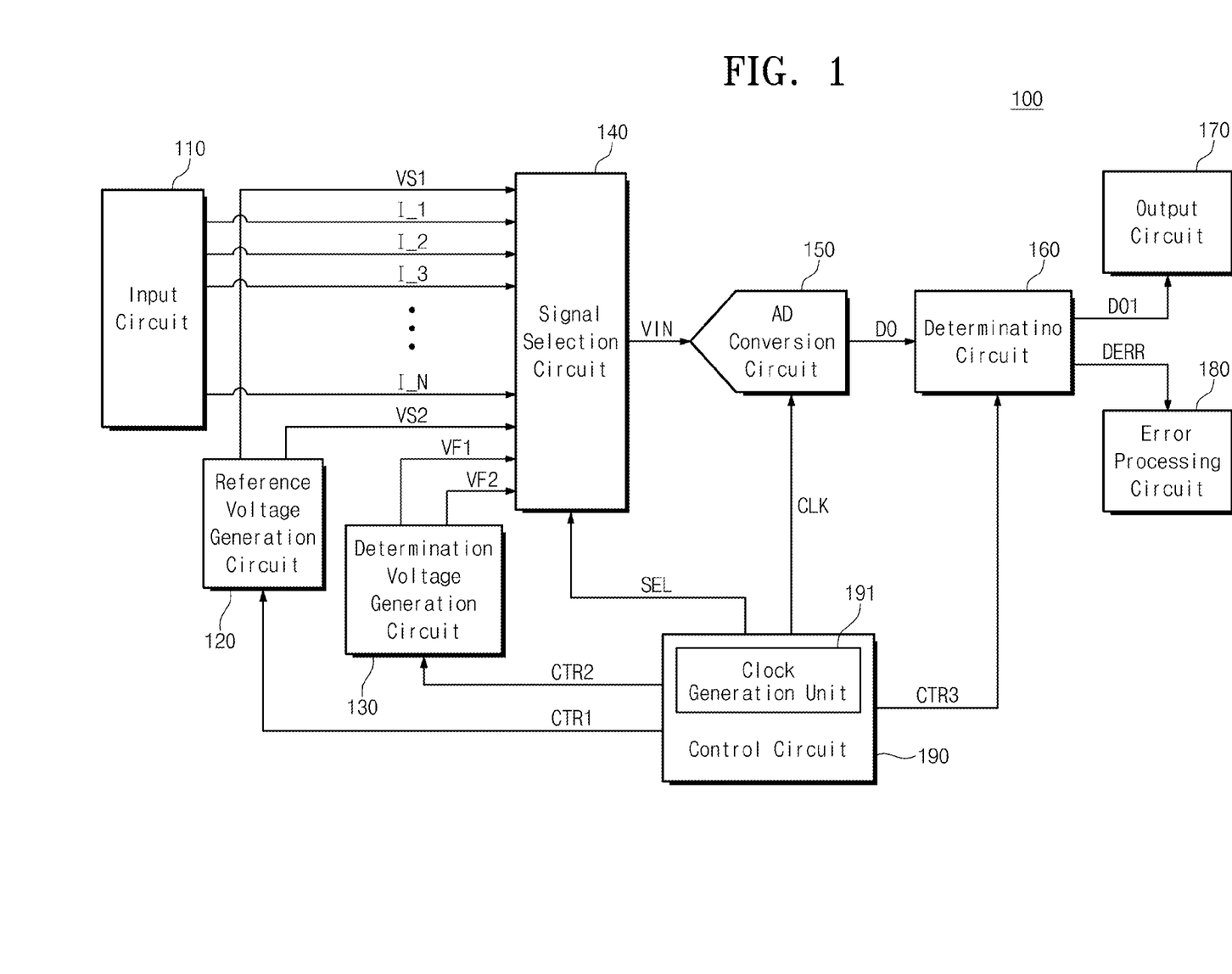
FIG. 1 is a block diagram of an analog-to-digital converting (ADC) device according to an embodiment of the inventive concept.

FIG. 1 is a block diagram of an analog-to-digital converting (ADC) device 100 according to an embodiment of the inventive concept. Referring to FIG. 1, the ADC device includes an input circuit 110, a reference voltage generation circuit 120, a determination voltage generation circuit 130, a signal selection circuit 140, an AD conversion circuit 150, a determination circuit 160, an output circuit 170, an error processing circuit 180, and a control circuit 190.

The input circuit 110 applies a plurality of analog input signals I_1 to I_N to the signal selection circuit 140. For example, the analog input signals I_1 to I_N may be signals that are measured from external sensors.

The reference voltage generation circuit 120 may output a reference voltage to the signal selection circuit 140 in response to a first control signal CTR1. For example, the reference voltage generation circuit 120 may output a first reference voltage VS1 and a second reference voltage VS2 in response to the first control signal CRT1. Also, the levels of the reference voltages VS1 and VS2 may be differently set.

The determination voltage generation circuit 130 may output a determination voltage VF to the signal selection circuit 140 in response to a second control signal CTR2. For example, the determination voltage generation circuit 130 may output a first determination voltage VF1 and a second determination voltage VF2 in response to the second control signal CRT2. Also, the levels of the determination voltages VF1 and VF2 should be set to be different from those of the reference voltages VS1 and VS2. However, the levels of the first determination voltage VF1 and the second determination voltage VF2 may also be equally set.

The signal selection circuit 140 is configured to operate in response to a selection signal SEL that is generated from the control circuit 190. Also, the signal selection circuit 140 may include a multiplexer.

In a first operation mode, the signal selection circuit 140 outputs the reference voltages VS1 and VS2 in response to the selection signal SEL. But the signal selection circuit 140 does not output the determination voltages VF1 and VF2.

For example, when the analog input signals I_1 to I_N are received from the input circuit 110, the signal selection circuit 140 may output the first reference voltage VS1 as an input voltage VIN in response to the selection signal SEL. Then, the signal selection circuit 140 may sequentially the analog input signals I_1 to I_N received from the input circuit 110 as the input voltage VIN. Then, the signal selection circuit 140 may output the second reference voltage VS2 as the input voltage VIN in response to the selection signal SEL.

In a second operation mode, the signal selection circuit 140 outputs the determination voltages VF1 and VF2 in response to the selection signal SEL. But the signal selection circuit 140 does not output the reference voltages VS1 and VS2.

For example, the signal selection circuit 140 may output, to the AD conversion circuit 150, the determination voltages VF1 and VF2 as the input voltage VIN instead of the reference voltages VS1 and VS2. The operation process in the second operation mode is described in more detail with reference to FIG. 5.

The AD conversion circuit 150 is configured to perform digital conversion in response to a reference clock signal CLK that is generated from the control circuit 190. A result of the conversion by the AD conversion circuit 150 is output as a digital signal DO.

For example, the AD conversion circuit 150 may perform the AD conversion by using a counter ramp or successive approximation method. However, the AD conversion method of the AD conversion circuit 150 is not limited thereto.

In the first operation mode, the determination circuit 160 compares first and second reference digital signals DS1 and DS2 that are obtained by the conversion of the reference voltages VS1 and VS2 among digital signals DO output from the AD conversion circuit 150, with first and second test patterns. For example, the first reference digital signal DS1 may be a bit string corresponding to a digital signal in the case where the first reference voltage VS1 is converted by the AD conversion circuit 150. For example, the second reference digital signal DS2 may be a bit string corresponding to a digital signal in the case where the second reference voltage VS2 is converted by the AD conversion circuit 150.

A bit string that is output in the form of individual binary data without digital conversion by the AD conversion circuit 150 may be a test pattern. For example, the first test pattern may be a bit string corresponding to a digital signal in the case where the first reference voltage VS1 is normally digital-converted.

For example, the second test pattern may be a bit string corresponding to a digital signal in the case where the second reference voltage VS2 is normally digital-converted.

The operation process in the first operation mode is described in more detail with reference to FIG. 2.

In the second operation mode, the determination circuit 160 compares first and second determination digital signals D-F1 and D_F2 that are obtained by the conversion of the reference voltages VF1 and VF2 among digital signals DO output from the AD conversion circuit 150, with first and second test patterns, respectively. For example, the first determination digital signal D_F1 may be a bit string corresponding to a digital signal in the case where the first determination voltage VF1 is digital-converted by the AD conversion circuit 150. For example, the second determination digital signal D_F2 may be a bit string corresponding to a digital signal that is obtained by the conversion of the second determination voltage VF2 by the AD conversion circuit 150.

The determination voltages VF1 and VF2 may have different levels from the first reference voltage VS1 and the second reference voltage VS2. Therefore, when the determination voltages VF1 and VF2 are digital-converted, the first and second determination digital signals D_F1 and D_F2 may be different from test patterns that correspond to the first and second reference voltages VS1 and VS2.

Since in the second operation mode, the first and second determination digital signals mismatch the first and second test pasterns, the determination circuit 160 may output an error signal DERR in the case where the determination circuit 160 normally operates. The operation process in the second operation mode is described in more detail with reference to FIG. 5.

The output circuit 170 may store digital signals DO1 transmitted from the determination circuit 160, and output the stored digital signals DO1 to an external device. For example, the external device may be a micro controller unit (MCU).

The error processing circuit 180 receives the error signal DERR that is transmitted by the determination circuit 160. In the first operation mode, the error processing circuit 180 may request to neglect the digital signals DO1 that are stored in the output circuit 170 through digital conversion of the analog input signals I_1 to I_N, in response to the error signal DERR. Alternatively, the error processing circuit 180 may request retransmission from the input circuit 110 in response to the error signal DERR. Alternatively, the error processing circuit 180 may request in response to the error signal DERR that the control circuit 190 should re-adjust an offset OFFSET in the AD conversion circuit 150.

Also, in the second operation mode, the error processing circuit 180 may request to output, to an external device, the digital signals DO1 that are stored in the output circuit 170 through digital conversion of the analog input signals I_1 to I_N, in response to the error signal DERR.

The control circuit 190 includes a clock generation unit 191. The clock generation unit 191 may generate the reference clock signal CLK. Also, the control signals CTR1 to CTR3 and SEL that are generated by the control circuit 190 may be signals that are synchronized with the reference clock signal CLK that is generated by the clock generation unit 191.

For example, the control circuit 190 may enable the generated reference clock signal CLK to be output to the AD conversion circuit 150.

For example, the control circuit 190 may use the first control signal CTR1 to enable the reference voltage generation circuit 120 to output the reference voltages VS1 and VS2.

For example, the control circuit 190 may enable the determination voltage generation circuit 130 to output the determination voltages VF1 and VF2 through the second control signal CTR2.

For example, when the AD conversion circuit 150 digital-converts and outputs the reference voltage VS1 or VS2 in response to the reference clock signal CLK, a test pattern corresponding to the reference voltage VS1 or VS2 may be included in the third control signal CTR3. That is, the control circuit 190 may provide first and second test patterns corresponding to the reference voltages VS1 and VS2, respectively to the determination circuit 160 through the third control signal CTR3.

The control circuit 190 may enable the signal selection circuit 140 to be in the first operation mode or in the second operation mode through the selection signal SEL.

For example, the control circuit 190 enables the signal selection circuit 130 to output the reference voltages VS1 and VS2 and the analog signals I_1 to I_N through the selection signal SEL in the first operation mode. In addition, the control circuit 190 enables the determination voltages VF1 and VF2 and the analog signals I_1 to I_N to be output through the selection signal SEL in the second operation mode.

Also, the control circuit 190 enables the AD conversion circuit 150 to perform digital conversion by using the reference clock signal CLK.

Figure 2:
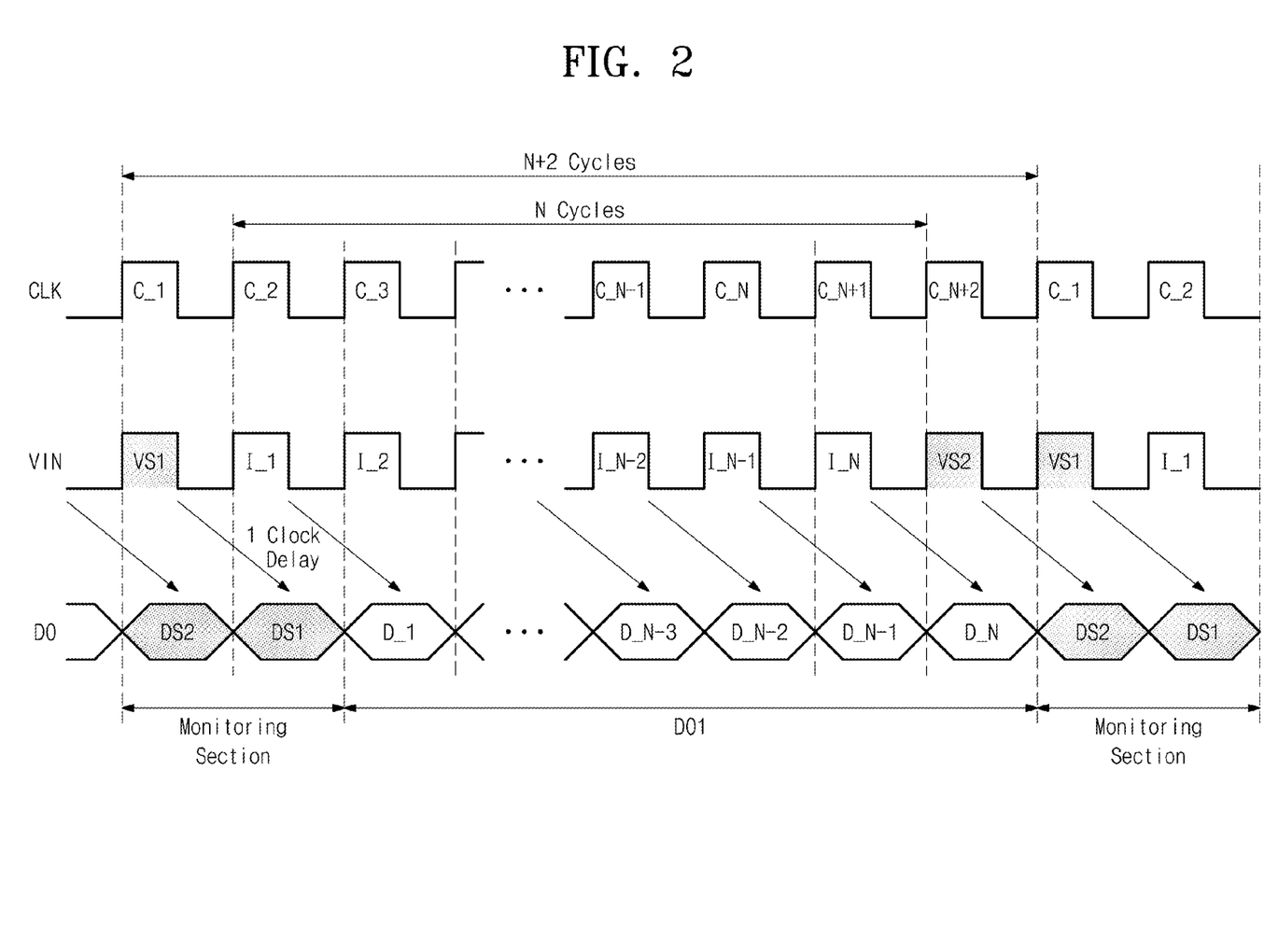
FIG. 2 is a timing diagram of an ADC device according to an embodiment of the inventive concept.

FIG. 2 is a timing diagram for the first operation mode of the inventive concept. The horizontal axis in FIG. 2 indicates a time axis and the vertical axis therein indicates signals.

Referring to FIGS. 1 and 2, the signal selection circuit 140 may output the reference voltages VS1 and VS2 and the analog signals I_1 to I_N in response to the selection signal SEL that is generated by the control circuit 190.

For example, in a first cycle C_1 of the reference clock signal CLK, the signal selection circuit 140 may output the first reference voltage VS1 in response to the selection signal SEL. Then, from a second cycle C_2 of the reference clock signal CLK to an N+1th cycle C_N+1 thereof, the signal selection circuit 140 may sequentially output the analog signals I_1 to I_N in response to the selection signal SEL. Then, in an N+2th cycle C_N+2 of the reference clock signal CLK, the signal selection circuit 140 may output the second reference voltage VS2 in response to the selection signal SEL.

For example, when the reference clock signal CLK transits to a high level, the AD conversion signal 150 may sample the analog input VIN output from the signal selection circuit 140 and hold the sampled analog input. Then, when the reference clock signal CLK transits to a low level, the AD conversion circuit 150 may convert the hold analog input signal into a digital signal. Therefore, the digital signal that corresponds to the analog signal selected at the signal selection circuit 140 by the selection signal SEL is delayed and output by one cycle of the reference clock signal that is generated by the clock generation unit 191.

For example, the first reference digital signal DS1 that is obtained by the conversion of the first reference voltage VS1 is output in the second cycle C_2 of the reference clock signal CLK. Then, digital signals D_1 to D_N that are obtained by the conversion of the analog input signals I_1 to I_N are output between a third cycle C_3 and the N+2th cycle C_N+2. Then, the second reference digital signal DS2 that is obtained by the conversion of the second reference voltage VS2 is output in the first cycle C_1 of the reference clock signal CLK.

For example, the number of analog inputs that are applied to the signal selection circuit 140 may be N, and a time taken to convert the input signals I_1 to I_N into the digital signals D_1 to D_N may be N cycles.

For example, when two reference voltages VS1 and VS2 are used, the number of the input voltages VIN that the signal selection circuit 140 outputs is N+2, including VS1, I_2 to I_N and VS2. Thus, a total time taken to convert the input voltage VIN into the digital signal DO may be N+2 cycles.

For example, the determination circuit 160 may compare the first reference digital signal DS1 obtained by the conversion of the first reference voltage VS1 with a first test pattern. When the first reference digital signal DS1 obtained by the conversion of the first reference voltage VS1 matches the first test pattern, the determination circuit 160 may continue to output, to the output circuit 170, the digital signals D_1 to D_N obtained by the conversion of the received analog input signals I_1 to I_N. In addition, the output circuit 170 may store the received digital signals D_1 to D_N.

For example, when the first reference digital signal DS1 obtained by the conversion of the first reference voltage VS1 mismatches the first test pattern, the determination circuit 160 generates an error signal DERR. The generated error signal DERR is transmitted to the error processing circuit 180. In addition, the error processing circuit 180 may request in response to the error signal DERR that the AD conversion circuit 150 should stop the digital conversion of the analog input signals I_1 to I_N.

For example, in the case where the determination circuit 160 compares the second reference digital signal DS2 obtained by the conversion of the second reference voltage VS2 with a second test pattern and as a result of the determination, they match, the determination circuit 160 may request to output, to the central processing unit (CPU), the digital signals D_1 to D_N that are obtained by the conversion of the analog input signals I_1 to I_N and that are stored in the output circuit 170.

For example, in the case where the determination circuit 160 compares a second digital bit string DS2 obtained by the conversion of the second reference voltage VS2 with the second test pattern and as a result of the determination, they mismatch, the determination circuit 160 generates an error signal DERR. The generated error signal DERR is transmitted to the error processing circuit 180. In addition, the error processing circuit 180 may request to neglect the digital signals D_1 to D_N that are obtained by the conversion of the analog input signals I_1 to I_N and that are stored in the output circuit 170, in response to the error signal DERR.

Thus, when the first operation mode is performed, it is possible to determine whether digital conversion is normally performed by the AD conversion circuit 150.

A built-in-self test (BIST) method needs parameter based quantitative calculation in order to measure the performance of the AD conversion circuit. Thus, the BIST method needs several hundreds to several thousands of cycles. However, the inventive concept may add a cycle taken to convert a reference voltage into a reference digital signal to determine whether the AD conversion circuit 150 normally operates. Thus, the inventive concept may real-time monitor a bit error that occurs in the digital conversion process of the AD conversion circuit 150.

Figure 3:
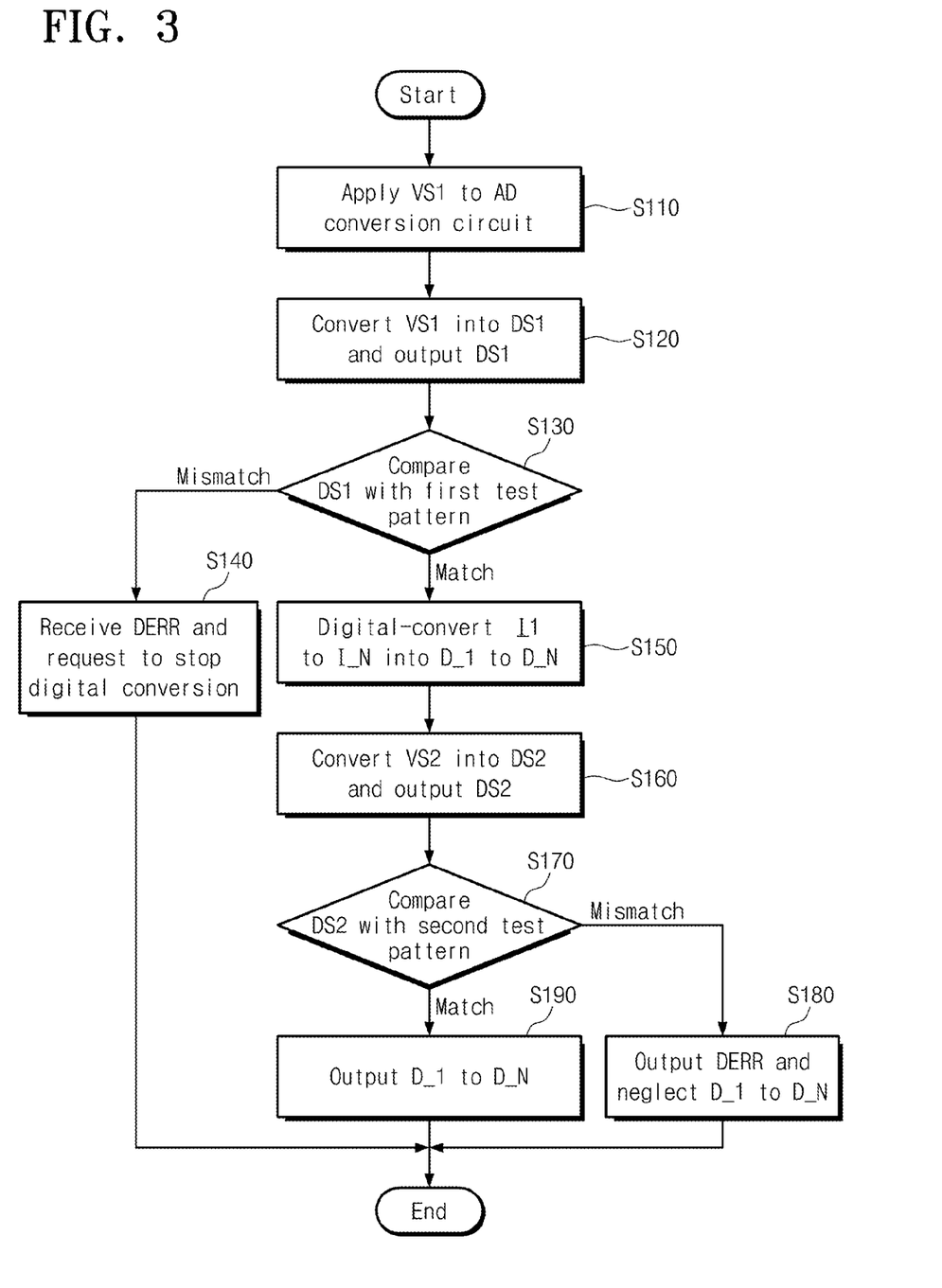
FIG. 3 is a flowchart of the monitoring method of an ADC device according to an embodiment of the inventive concept.

FIG. 3 is a flowchart of the operating method of an ADC device according to the first operation mode in FIG. 1.

Referring to FIGS. 1 and 3, in step S110, the signal selection circuit 140 may output the first reference voltage VS1 to the AD conversion circuit 150 in response to the selection signal SEL.

In step S120, the first reference digital signal DS1 that is obtained by the conversion of the first reference voltage VS1 may be output to the determination circuit 160. Also, the first test pattern may be included in the third control signal CTR3 to be transmitted to the determination circuit 160.

In step S130, the determination circuit 160 may compare the first reference digital signal DS1 obtained by the conversion of the first reference voltage VS1 with the first test pattern. That is, it is possible to determine whether the first reference digital signal DS1 obtained by the conversion of the first reference voltage VS1 matches the first test pattern.

In step S140, in the case where as a result of the comparison, they mismatch, the determination circuit 160 may generate the error signal DERR. The generated error signal DERR may be transmitted to the error processing circuit 180.

In addition, the error processing circuit 180 may request in response to the error signal DERR that the AD conversion circuit 150 should stop the digital conversion of the analog input signals I_1 to I_N.

In step S150, in the case where as the result of the comparison they match, the determination circuit 160 may continue to output, to the output circuit 170, the digital signals D_1 to D_N that are obtained by the conversion of the received analog input signals I_1 to I_N. In addition, the output circuit 170 may store the received digital signals D_1 to D_N.

In step S160, the second reference digital signal DS2 that is obtained by the conversion of the second reference voltage VS2 may be output to the determination circuit 160. Also, the second test pattern may be included in the third control signal CTR3 to be transmitted to the determination circuit 160.

In step S170, the determination circuit 160 may compare the second reference digital signal DS2 obtained by the conversion of the second reference voltage VS2 with the second test pattern. That is, it is possible to determine whether the second reference digital signal DS2 obtained by the conversion of the second reference voltage VS2 matches the second test pattern.

In step S180, in the case where as a result of the comparison, they mismatch, the determination circuit 160 may generate the error signal DERR. The generated error signal DERR is transmitted to the error processing circuit 180. In addition, the error processing circuit 180 may request to neglect the digital signals D_1 to D_N that are obtained by the conversion of the analog input signals I_1 to I_N and that are stored in the output circuit 170, in response to the error signal DERR.

In step S190, in the case where as a result of the comparison, they match, the determination circuit 160 may request to output, to the CPU, the digital signals D_1 to D_N that are obtained by the conversion of the analog input signals I_1 to I_N and that are stored in the output circuit 170.

Figure 4:
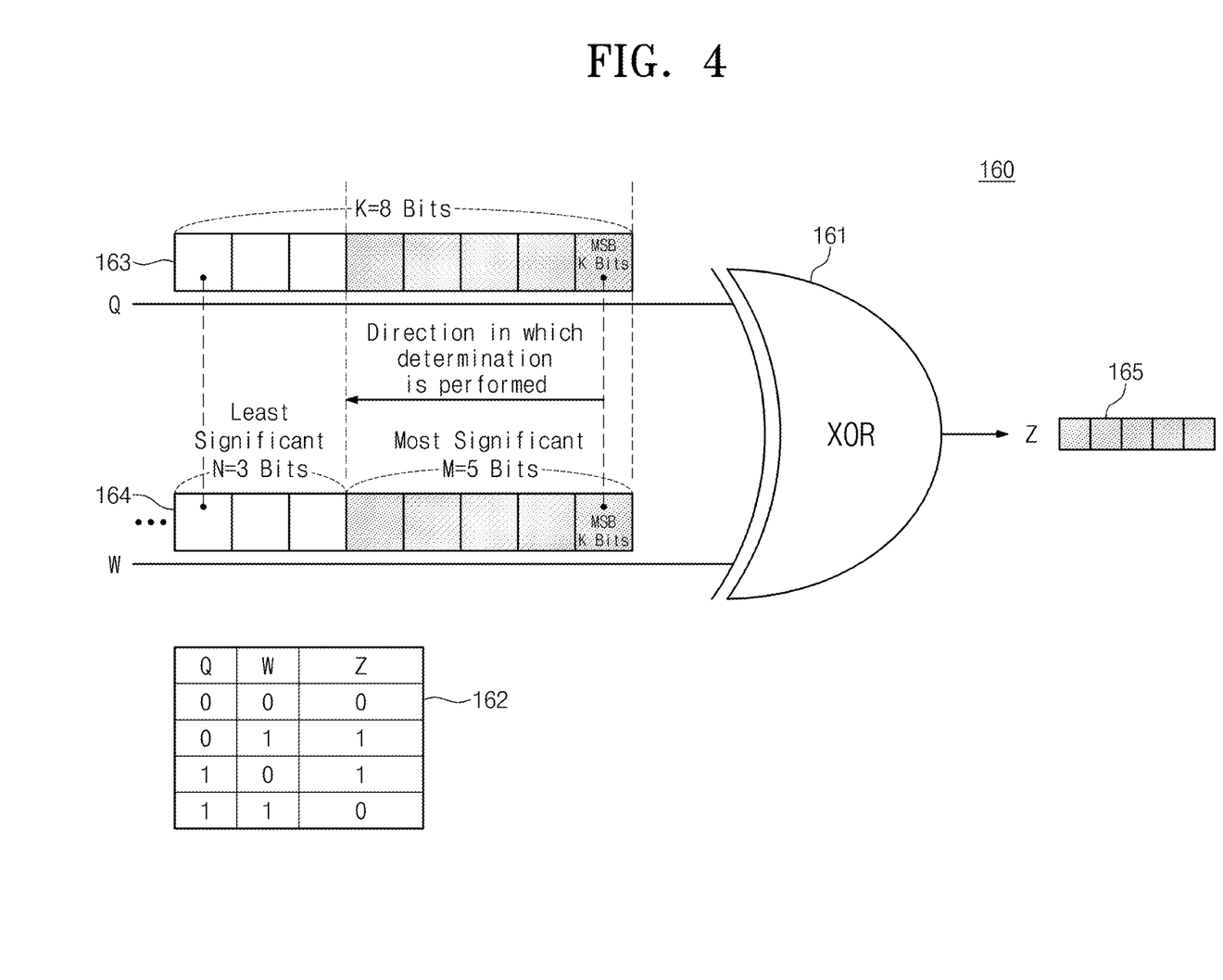
FIG. 4 is a diagram related to a determination logic for detecting a bit error from a determination circuit.

FIG. 4, in detail, shows the process of comparing, by the determination circuit 160, a bit string corresponding to the digital signal obtained by the conversion of the reference voltage or the determination voltage by the AD conversion circuit 150 with a test pattern, to determine whether they match.

A logic determination unit 161 uses logic for determination to compare the bit string corresponding to the digital signal obtained by the conversion of the reference voltage or the determination voltage by the AD conversion circuit 150 with the test pattern.

Also, the logic determination unit 161 may use XOR logic for implementation as shown in FIG. 4. Also, the logic determination unit 161 of the inventive concept may use NAND logic for implementation. That is, the determination logic used in the logic determination unit 161 is not limited thereto.

Referring to a truth table 162 in FIG. 4, the logic determination unit used in the determination circuit 160 may use an XOR gate.

That is, only when both input 1, Q and input 2, W are 0 or 1, 0 is output to an output Z. In the case where one or more of the input 1, Q and the input 2, W are 1, 1 is output to the output Z.

Referring to FIGS. 1 and 4, in the first operation mode, a bit string 163 corresponding to the digital signal that is obtained by the conversion of the reference voltage VS1 or VS2 or the determination voltage VF1 or VF2 by the AD conversion circuit 150 may be input into the input 1, Q. In addition, a first or second test pattern 164 that corresponds to the reference voltage VS1 or VS2 may be input into the input 2, W. That is, the logic determination unit 161 may compare, the bit string 163 corresponding to the digital signal that is obtained by the conversion of the reference voltage VS1 or VS2 or the determination voltage VF1 or VF2 by the AD conversion circuit 150, with first or second test pattern 164 that corresponds to the reference voltage VS1 or VS2, and output a result of the comparison to the output Z.

For example, in the case where a bit string 165 of the output Z of the logic determination unit 161 that is used in the determination circuit 160 includes 0 only, the determination logic is satisfied. However, in the case where there is one or more is in the bit string 165 of the output Z, the result of the comparison does not satisfy the determination logic.

For example, the test pattern 164 that corresponds to the reference voltage VS1 or VS2 may be included in the third control signal CTR3.

For example, the first and second test patterns may include K (=8 in FIG. 4) or M (=5 in FIG. 4) bits. In addition, the bit string DS1, DS2, D_F1 or D_F2 corresponding to the digital signal that is obtained by the conversion of the reference voltage VS1 or VS2 or the determination voltage VF1 or VF2 may include K bits.

For example, the logic determination unit used in the determination circuit 160 may adjust a range of comparison to M (=5 in FIG. 4) bits including most significant bit MSB.

For example, in the case of an 8-bit output where K is set to 8 as shown in FIG. 4, the determination circuit 160 uses the truth table 162 of the XOR gate to sequentially determine only 5 (=M) bits from MSB.

By adjusting the resolution of the determination circuit 160, it is possible to prevent the digital output signals DO1 obtained by conversion by the AD conversion circuit 150 from becoming neglected due to a negligible offset OFFSET in the AD conversion circuit 150 or external noise that may occur when passing through a transmission line.

Figure 5:
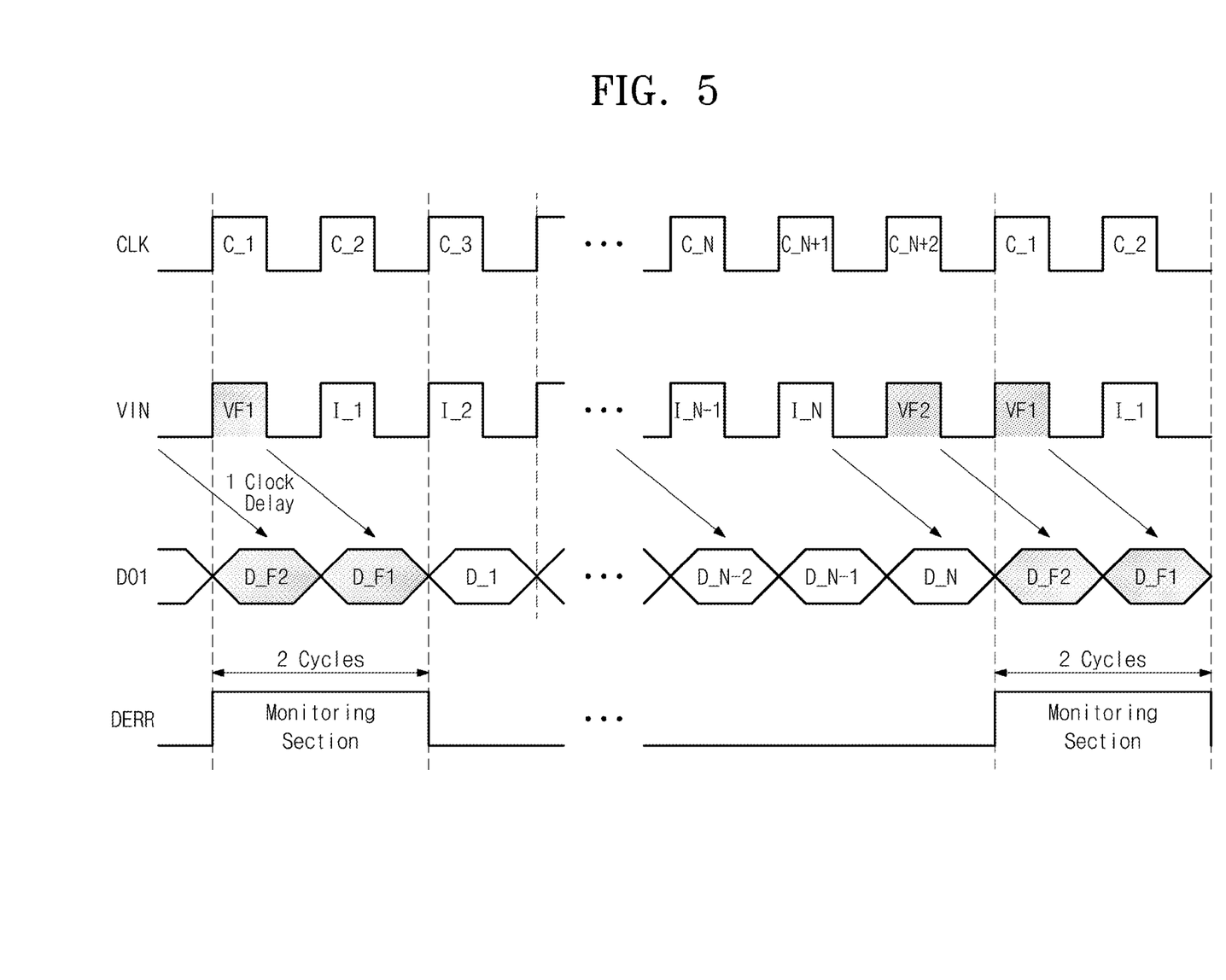
FIG. 5 shows a timing diagram that checks whether a monitoring function normally operates.

FIG. 5 is a timing diagram for the second operation mode of the inventive concept. The horizontal axis in FIG. 5 indicates a time and the vertical axis therein indicates signals.

Referring to FIGS. 1 and 5, in the first cycle C_1 of the reference clock signal CLK, the signal selection circuit 140 may output the first determination voltage VF1 in response to the selection signal SEL. Then, from a second cycle C_2 of the reference clock signal CLK to an N+1th cycle C_N+1 thereof, the signal selection circuit 140 sequentially outputs the analog signals I_1 to I_N in response to the selection signal SEL. Then, in an N+2th cycle C_N+2 of the reference clock signal CLK, the signal selection circuit 140 may output the second determination voltage VF2 in response to the selection signal SEL.

For example, a bit string D_F1 corresponding to the digital signal obtained by the conversion of the first determination voltage VF1 that is output in the first cycle C_1 is output in the second cycle C_2 of the reference clock signal CLK. Then, digital signals D_1 to D_N that are obtained by the conversion of the analog input signals I_1 to I_N are output between a third cycle C_3 and the N+2th cycle C_N+2. A bit string D_F2 corresponding to the digital signal obtained by the conversion of the second determination voltage VF2 that is output in the N+2th cycle C_N+2 is output in the first cycle C_1 of the reference clock signal CLK.

The operation process of the second operation mode is described in more detail with reference to FIGS. 1 and 5.

For example, in the case where the determination circuit compares the first determination digital signal D_F1 obtained by the conversion of the first determination voltage VF1 with a first test pattern and as a result of the comparison, they mismatch, the determination circuit 160 may generate a first error signal DERR. The generated first error signal DERR may be transmitted to the error processing circuit 180. At the same time, the determination circuit 160 may continue to output, to the output circuit 170, the digital signals D_1 to D_N that are obtained by the conversion of the received analog input signals I_1 to I_N. In addition, the output circuit 170 may store the received digital signals D_1 to D_N.

For example, in the case where the determination circuit compares the first determination digital signal D_F1 obtained by the conversion of the first determination voltage VF1 with the first test pattern and as a result of the comparison, they match, the determination circuit 160 does not generate an error signal DERR. Thus, the determination circuit 160 may request to neglect the digital signals D_1 to D_N that are obtained by the conversion of the analog input signals I_1 to I_N and that will be stored in the output circuit 170.

For example, in the case where the determination circuit compares the second determination digital signal D_F2 obtained by the conversion of the second determination voltage VF2 with a second test pattern and as a result the comparison, they mismatch, the determination circuit 160 may generate an error signal DERR. The generated error signal DERR may be transmitted to the error processing circuit 180. The error processing circuit 180 may request to output, to the CPU, the digital signals D_1 to D_N that are obtained by the conversion of the analog input signals I_1 to I_N and that are stored in the output circuit 170, in response to the error signal DERR.

For example, in the case where the determination circuit compares the second determination digital signal D_F2 obtained by the conversion of the second determination voltage VF2 with the first test pattern and as a result of the comparison, they match, the determination circuit 160 does not generate an error signal DERR. The determination circuit 160 may request to neglect the digital signals D_1 to D_N that are obtained by the conversion of the analog input signals I_1 to I_N and that are stored in the output circuit 170.

For example, in the case where the error signal DERR is output from the determination circuit 160 to the error processing circuit 180 continuously for two cycles as shown in FIG. 5, it may be seen that the determination circuit 160 normally operates.

Thus, when the second operation mode is performed, it is possible to determine whether the determination circuit 160 normally operates, according to whether the error signal DERR is output to the error processing circuit 180 continuously for two cycles.

Also, as an example of a different operation from FIG. 5, it is possible to set a test mode in which it is only determined whether the determination circuit 160 normally operates. That is, in the test mode, the signal selection circuit 140 may output a determination voltage VF as the input voltage VIN from the first cycle C_1 of the reference clock signal CLK to the N+2 cycle thereof. As mentioned earlier, the bit string D_F corresponding to the digital signal that is obtained by the conversion of the determination voltage VF is different from a test pattern. Thus, in the case where the error processing circuit 180 receives the error signal DERR in all cycles C_1 to C_N+2 of the reference clock signal CLK, it may be seen that the determination circuit 160 normally operates.

Figure 6:
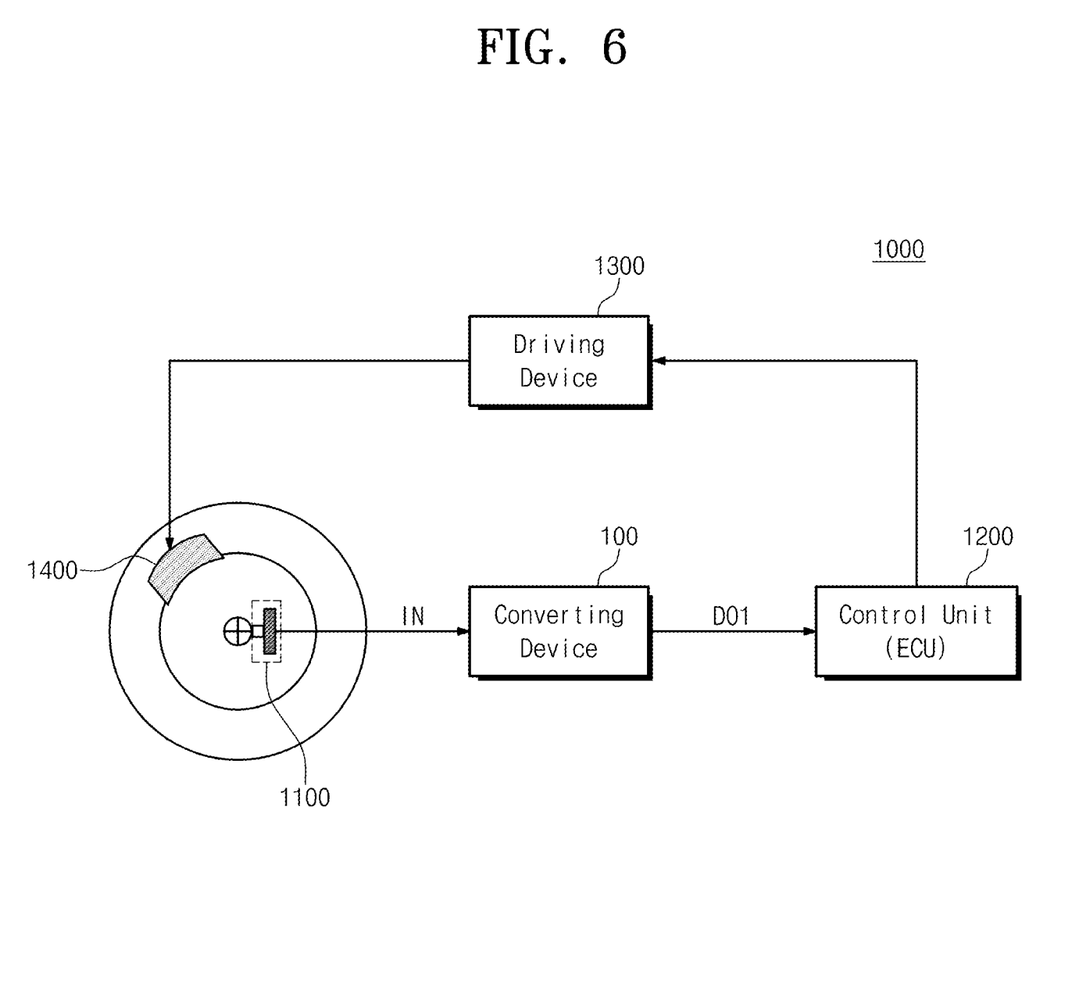
FIG. 6 shows one of applications of the inventive concept.

FIG. 6 shows one of applications of the inventive concept.

FIG. 6 represents a schematic diagram of a wheel device 1000. A sensor unit 1100 is disposed in a wheel to sense the rotation of a wheel and has, as inputs I_1 to I_N, values corresponding to the number of times the wheel rotates. In this case, the number of inputs IN may be in plurality according to whether a sensor is installed at each wheel.

A converting device 100 may include an ADC device according to an embodiment of the inventive concept. The converting device 100 may convert and output an analog input IN into a digital signal DO1. The digital signal DO1 output by the converting device 100 may be transmitted to a control unit 1200. The control unit includes an electronic control unit (ECU) or an MCU. The control units may analyze the digital signal DO1 input to the wheel device to later determine the operation of the wheel, and transmit a digital output value suitable for the determined operation to the driving device 1300.

The driving device 1300 may determine the operation of a wheel brake according to the digital output value received from the control unit 1200.

The wheel brake 1400 may adjust a width to decrease the rotation speed of the wheel according to the control signal of the driving device 1300.

Embodiments of the inventive concept provide an ADC device that real-time monitors a bit error occurring in the digital conversion process to have more enhanced reliability than a typical ADC device, and a method of monitoring the ADC device.

Although the detailed description of the inventive concept has provided particular embodiments, there may be many variations without departing from the scope of the inventive concept. Therefore, the scope of the inventive concept should not be limited to the above-described embodiments but should be defined by equivalents of the following claims as well as the following claims.

What is claimed is:

1. An analog-to-digital converting device comprising:
    a reference voltage generation circuit configured to generate a reference voltage;
    a signal selection circuit configured to output analog input signals received from an input circuit and the reference voltage generated from the reference voltage generation circuit, in response to a selection signal;
    an analog-to-digital (AD) conversion circuit configured to convert an output signal from the signal selection circuit into a digital signal; and
    a determination circuit configured to compare a reference digital signal obtained by conversion of the reference voltage with a test pattern for the reference voltage in order to determine whether the reference digital signal matches the test pattern.

2. The analog-to-digital converting device of claim 1, wherein the reference voltage generation circuit is configured to generate a first reference voltage and a second reference voltage in a first operation mode.

3. The analog-to-digital converting device of claim 2, wherein the signal selection circuit is configured to output the first reference voltage, sequentially output the analog input signals, and then output the second reference voltage.

4. The analog-to-digital converting device of claim 2, wherein the determination circuit is configured to compare a first reference digital signal obtained by conversion of the first reference voltage with a first test pattern for the first reference voltage, output digital signals obtained by conversion of the analog input signals in a case where as a result of the comparison, there is matching, and output an error signal in a case where as a result of the comparison, there is mismatching.

5. The analog-to-digital converting device of claim 4, further comprising an output circuit configured to store the digital signals obtained by the conversion of the analog input signals,
    wherein the determination circuit is configured to compare a second reference digital signal obtained by conversion of the second reference voltage with a second test pattern for the second reference voltage, request to output the digital signals stored in the output circuit in a case where as a result of the comparison, there is matching, and request to neglect the digital signals stored in the output circuit in a case where as a result of the comparison, there is mismatching.

6. The analog-to-digital converting device of claim 2, further comprising a determination voltage generation circuit that is configured to generate a first determination voltage and a second determination voltage in a second operation mode.

7. The analog-to-digital converting device of claim 6, wherein the signal selection circuit is configured to output the first determination voltage, sequentially output the received analog input signals, and then output the second determination voltage, in the second operation mode.

8. The analog-to-digital converting device of claim 6, further comprising an output circuit configured to store digital signals obtained by conversion of the analog input signals,
    wherein the determination circuit is configured to compare first and second determination digital signals obtained by conversion of the first and second determination voltages with first and second test patterns for the first and second reference voltages, respectively and request to neglect the digital signals stored in the output circuit in a case where as a result of the comparison, there is at least one matching.

9. The analog-to-digital converting device of claim 6, wherein the determination circuit is configured to compare some of first and second determination digital signals obtained by conversion of the first and second determination voltages with some of first and second test patterns for the first and second reference voltages, respectively to determine whether there is matching.

10. The analog-to-digital converting device of claim 1, wherein the determination circuit is configured to compare a part of the reference digital signal obtained by conversion of the reference voltage with a part of the test pattern for the reference voltage.

11. An operating method of an analog-to-digital converting device, the operating method comprising:
   converting a reference voltage into a reference digital signal by the analog-to-digital converging device;
   comparing the reference digital signal with a test pattern by the analog-to-digital converging device; and
   converting analog signals received from an external device into digital signals and outputting the digital signals by the analog-to-digital converging device, when a part of the reference digital signal matches at least a part of the test pattern.

12. An operating method of an analog-to-digital converting device, the operating method comprising:
   converting a determination voltage into a determination digital signal by the analog-to-digital converging device;
   comparing the determination digital signal with a test pattern by the analog-to-digital converging device; and
   determining that the determination does not normally operate, when a part of the a part of the reference digital signal matches at least a part of the test pattern digital signal matches at least a part of the test pattern.

* * * * *